(12) United States Patent
Hsieh

(10) Patent No.: US 9,252,758 B2
(45) Date of Patent: Feb. 2, 2016

(54) MULTI-PHASE PHASE INTERPOLATOR

(75) Inventor: Hong-Yean Hsieh, Sunnyvale, CA (US)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 1682 days.

(21) Appl. No.: 12/207,777

(22) Filed: Sep. 10, 2008

(65) Prior Publication Data

US 2009/0251189 A1 Oct. 8, 2009

Related U.S. Application Data

(60) Provisional application No. 61/043,128, filed on Apr. 8, 2008.

(51) Int. Cl.
*H03H 11/16* (2006.01)
*H03K 5/13* (2014.01)
*H03K 5/00* (2006.01)

(52) U.S. Cl.
CPC ........ *H03K 5/13* (2013.01); *H03K 2005/00052* (2013.01)

(58) Field of Classification Search
USPC .................................................. 327/231–290
See application file for complete search history.

(56) References Cited

U.S. PATENT DOCUMENTS

| | | | | |
|---|---|---|---|---|
| 4,800,399 | A * | 1/1989 | Long et al. | 347/183 |
| 5,012,142 | A * | 4/1991 | Sonntag | 327/281 |
| 6,194,920 | B1* | 2/2001 | Oguri | 327/65 |
| 6,977,534 | B2* | 12/2005 | Radelinow | 327/112 |
| 7,248,125 | B1 | 7/2007 | Talbot | |
| 7,319,345 | B2 | 1/2008 | Farjad-rad et al. | |
| 2005/0024117 | A1 | 2/2005 | Kubo et al. | |
| 2005/0083109 | A1 | 4/2005 | Lin | |

OTHER PUBLICATIONS

Takanori Saeki, et al. "A 1.3-Cycle Lock Time, Non-PLL/DLL Clock Multiplier BAsed on Direct Clock Cycle Interpolation for Clock on Demand", Nov. 2000, pp. 1581-1586, IEEE Journal of Solid-State Circuits, vol. 35, No. 11.

* cited by examiner

*Primary Examiner* — Brandon S Cole
(74) *Attorney, Agent, or Firm* — McClure, Qualey & Rodack, LLP

(57) ABSTRACT

A multi-phase phase interpolator receives two input clocks to generate several equally spaced output clocks using several phase interpolators. A phase interpolator may include a first circuit branch and a second circuit branch with output nodes that are connected together to provide an output clock. The output clock may be generated at least based on resistor values of the phase interpolator.

9 Claims, 14 Drawing Sheets

MULTI-PHASE PHASE INTERPOLATOR

CROSS-REFERENCE TO RELATED APPLICATION

This application claims the benefit of U.S. Provisional Application No. 61/043,128, filed on Apr. 8, 2008, which is incorporated herein by reference in its entirety.

BACKGROUND OF THE INVENTION

1. Field of the Invention

The present invention relates generally to electrical circuits, and more particularly but not exclusively to phase interpolators.

2. Description of the Background Art

Phase interpolators are widely used to generate a plurality of multi-phase clocks from two clock sources. An ideal multi-phase phase interpolator 100 is shown FIG. 1. The phase interpolator 100 receives two input clocks $c_1$ and $c_2$ and generates (m+1) output clocks, which in FIG. 1 comprise output clocks $p_0$ to $p_m$.

FIG. 2 shows the waveforms for input clocks $c_1$ and $c_2$ and output clocks $p_0$ to $p_m$ of the ideal phase interpolator 100. As shown in FIG. 2, the time spacing between the input clocks $c_1$ and $c_2$ is equal to $\Delta$. In other words, input clock $c_2$ has the same waveform as the input clock $c_1$ except delayed by an amount $\Delta$. The output clock $p_0$ and $p_m$ are simply from delaying inverted clocks $c_1$ and $c_2$, respectively, by a specific amount $\delta$. That is, the output clock $p_0$ is the input clock $c_1$ inverted and delayed by an amount $\delta$, and the output clock $p_m$ is the input clock $c_2$ inverted and delayed by an amount $\delta$. The other output clocks, i.e., output clocks $p_1$ to $P_{m-1}$, are generated by interpolating clocks $c_1$ and $c_2$, and are equally spaced between $p_0$ and $p_m$. With (m+1) output clocks, the time spacing between any two neighboring output clocks is equal to $\Delta/m$, which represents 1 least significant bit (LSB).

SUMMARY

In an embodiment, an (m+1)-phase phase interpolator receives a first input clock and a second input clock to generate (m+1) equally spaced output clocks. The first input clock leads the second input clock by an amount $\Delta$. The generated (m+1) output clocks comprise a plurality of signals of the same waveform but uniformly displaced in time with a spacing of $\Delta/m$. The (m+1)-phase phase interpolator comprises (m+1) voltage-mode phase interpolators. A first voltage-mode phase interpolator receives only the first input clock to generate a first output clock comprising the first input clock inverted and delayed by an amount $\delta$. The (m+1)-th voltage-mode phase interpolator receives only the second input clock to generate the (m+1)-th output clock comprising the second input clock inverted and delayed by an amount $\delta$. The other voltage-mode phase interpolators receive both the first and second input clocks to generate other output clocks interpolated from the first and second input clocks.

In an embodiment, a single-ended voltage-mode phase interpolator receives a first input clock and a second input clock to generate equally spaced output clocks. The first input clock leads the second clock by an amount $\Delta$. The single-ended voltage-mode phase interpolator comprises two circuit branches: the first input clock controls the first circuit branch and the second input clock controls the second circuit branch. The output nodes of the first and second circuit branches are connected together. Each circuit branch comprises two sub-branches: one sub-branch is from the positive power supply to the output node, and the other sub-branch is from the negative power supply to the output node. Each sub-branch comprises a resistor and a switch. When the switch in a sub-branch is turned ON, current flows between the two terminals of this sub-branch. Otherwise, no current flows between the two terminals of this sub-branch. It is noted that only one of the two switches in each branch will be turned ON at any time. In other words, in the first circuit branch, if the switch between the positive power supply and the output node is turned ON, the switch between the negative power supply and the output node is turned OFF. Conversely, if the switch between the positive power supply and the output node is turned OFF, the switch between the negative power supply and the output node is turned ON.

In another embodiment, a differential voltage-mode phase interpolator receives a first differential pair of input clocks and a second differential pair of input clocks to generate differential pairs of output clocks. The first differential pair of input clocks leads the second differential pair of input clocks by an amount $\Delta$. Each differential pair of input clocks comprises two complementary single-ended clocks. The differential voltage-mode phase interpolator comprises two disjoint parts. Each disjoint part processes single-ended input clock signals out of the differential input clock signals and comprises two circuit branches, with a single-ended input clock out of the first differential pair of input clocks controlling the first circuit branch and a single-ended input clock out of the second differential pair of input clocks controlling the second circuit branch. The output nodes of the first and second circuit branches are connected together. Each circuit branch comprises two sub-branches: one sub-branch is from the positive power supply to the output node, and the other sub-branch is from the negative power supply to the output node. Each sub-branch comprises a resistor and a switch. When the switch in a sub-branch is turned ON, current flows between the two terminals of this sub-branch. Otherwise, no current flows between the two terminals of this sub-branch. It is noted that only one of two switches in each branch will be turned ON at any time. In other words, in the first circuit branch, if the switch between the positive power supply and the output node is turned ON, the switch between the negative power supply and the output node is turned OFF. Conversely, if the switch between the positive power supply and the output node is turned OFF, the switch between the negative power supply and the output node is turned ON.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present invention pertains to circuits and methods for generating equally spaced clocks. Embodiments of the present invention allow for phase interpolators with reduced integral nonlinearity (INL) and differential nonlinearity (DNL), and may employ static interpolation circuits to reduce standby power consumption.

Figure 3:
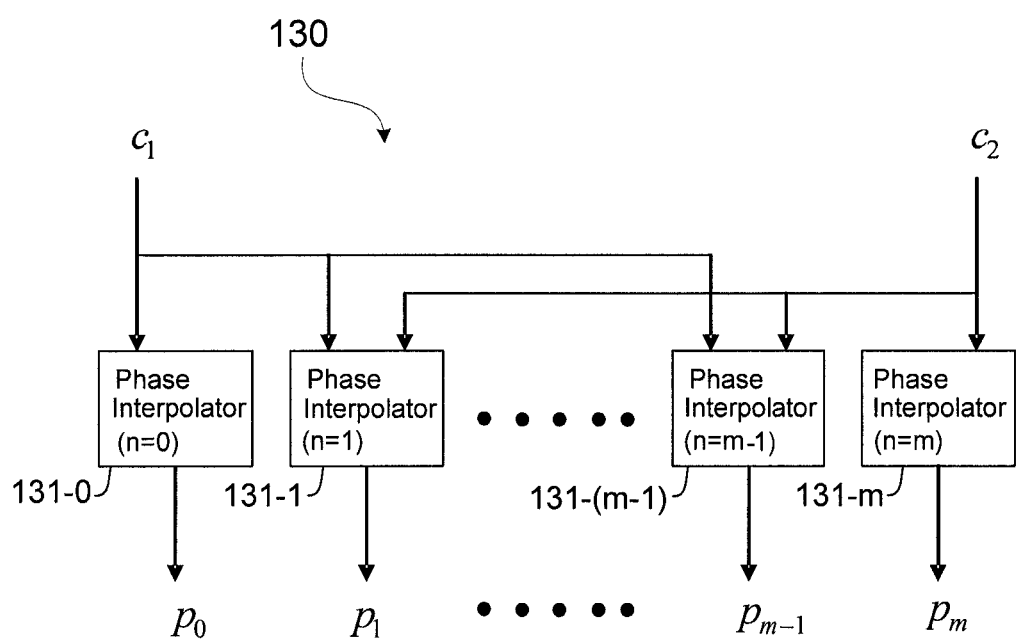
FIG. 3 shows a block diagram of a multi-phase phase interpolator in accordance with an embodiment of the present invention.

Referring now to FIG. 3, there is shown a block diagram of a multi-phase phase interpolator 130 in accordance with an embodiment of the present invention. In the example of FIG. 3, the phase interpolator 130 receives two input clocks $c_1$ and $C_2$ to generate (m+1) equally spaced output clocks $p_0$ to $p_m$ using (m+1) voltage-mode phase interpolators 131 (i.e., 131-0, 131-1, . . . 131-(m−1), 131-m). As a particular example, with m=3, the phase interpolator 130 will generate four (i.e., 3+1) output clocks $p_0$ to $p_3$ using four voltage-mode phase interpolators 131.

In the example of FIG. 3, each voltage-mode phase interpolator 131 is parameterized by a variable n. The first (i.e., n=0 or phase interpolator 131-0) and last (i.e., n=m or phase interpolator 131-m) interpolators function as delay elements. More specifically, the phase interpolator 131-0 generates the output clock PO by inverting and delaying the input clock $c_1$ by an amount δ. Similarly, the phase interpolator 131-m generates the output clock $p_m$ by inverting and delaying the input clock $C_2$ by an amount δ. The input clock $c_1$ leads the input clock $c_2$ by an amount Δ. As can be appreciated by those of ordinary skill in the art, the amounts Δ and δ may be in terms of phase (e.g., degrees) or time (e.g., seconds). As will be more apparent below, a voltage-mode phase interpolator 131 may be implemented as a single-ended or differential circuit.

Figure 1:
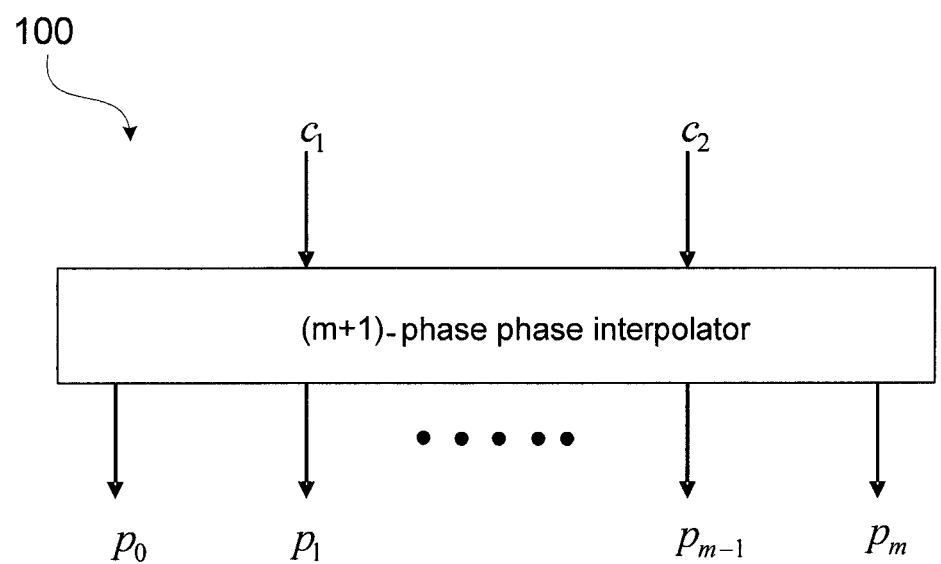
FIG. 1 shows a schematic diagram of an ideal multi-phase phase interpolator.
Figure 2:
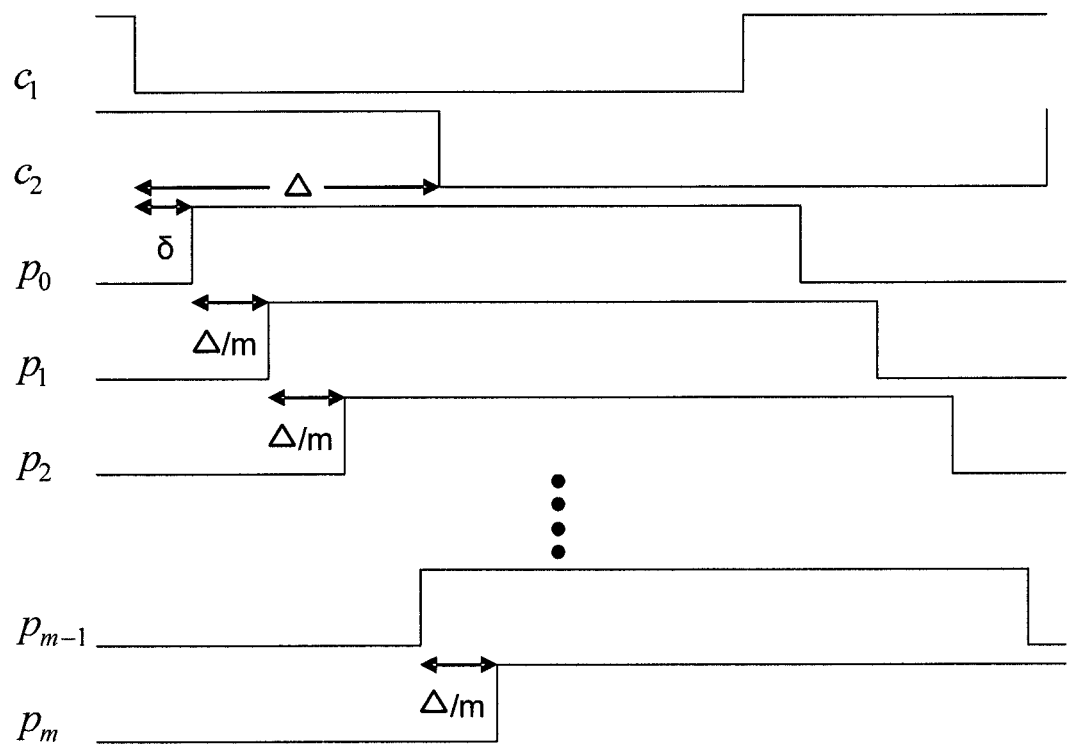
FIG. 2 shows waveforms of input clocks and output clocks of an ideal phase interpolator.

In the example of FIG. 3, each phase interpolator 131 except the first and last ones (i.e., phase interpolators 131-0 and 131-m) receives both input clocks $c_1$ and $c_2$ to generate an interpolated output clock $p_n$. More specifically, the phase interpolators 131-1 to 131-(m−1) generate output clocks $p_1$ to $p_{m-1}$, respectively, by interpolating the input clocks $c_1$ and $c_2$ such that the output clocks $p_0$ to $p_m$ are equally spaced and have linearly distributed phases as in the timing diagram of FIG. 2. That is, the multi-phase phase interpolator 130 is configured to generate ideal waveforms as in FIG. 2 as much as practically possible.

Figure 4:
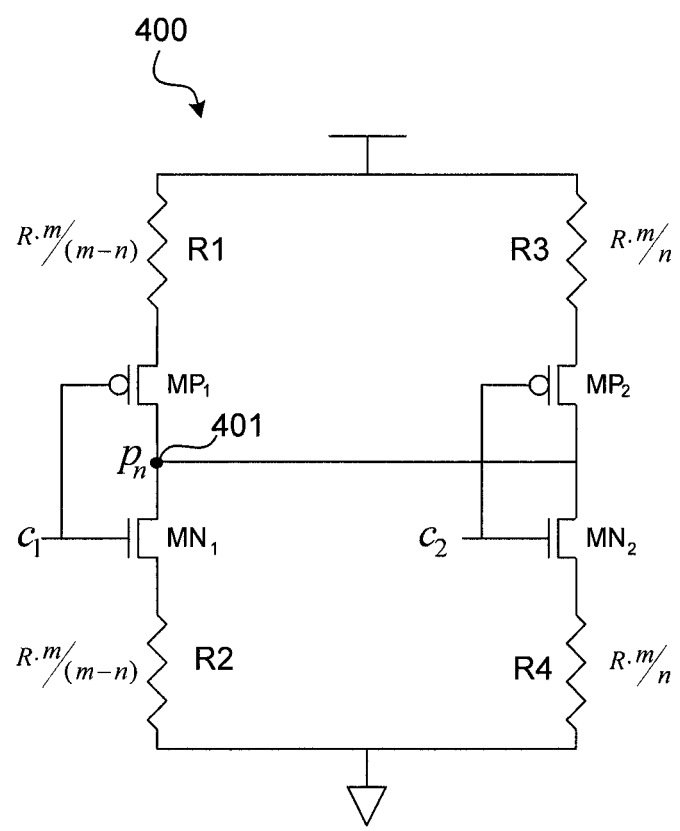
FIG. 4 shows a schematic diagram of a single-ended voltage-mode phase interpolator in accordance with an embodiment of the present invention.

FIG. 4 shows a schematic diagram of a single-ended voltage-mode phase interpolator 400 in accordance with an embodiment of the present invention. The phase interpolator 400 receives the two input clocks $c_1$ and $c_2$ to generate an output clock $p_n$ at a node 401. The single-ended voltage-mode phase interpolator 400 is a particular embodiment of a phase interpolator 131 shown in FIG. 3. That is, the phase interpolator 400 may be used as a phase interpolator 131 in the multi-phase phase interpolator 130.

In the example of FIG. 4, the phase interpolator 400 comprises a first circuit branch and a second circuit branch. The outputs of the first and second circuit branches are connected together at the node 401. The first circuit branch comprises a first sub-branch comprising a resistor R1 and a p-type metal oxide semiconductor (PMOS) transistor $MP_1$ and a second sub-branch comprising an n-type metal oxide semiconductor (NMOS) transistor $MN_1$ and a resistor R2. The second circuit branch comprises a first sub-branch comprising a resistor R3 and a PMOS transistor $MP_2$ and a second sub-branch comprising an NMOS transistor $MN_2$ and a resistor R4. Embodiments of the present invention are especially advantageous in phase interpolators comprising MOS transistors because of tendency of MOS transistors to introduce phase inaccuracy. The resistors R1, R2, R3, and R4 may be configured to generate a particular output clock $p_n$.

In the example of FIG. 4, the input clock $c_1$ is connected to the gates of the PMOS transistor $MP_1$ and NMOS transistor $MN_1$ to control the first circuit branch. Similarly, the input clock $c_2$ is connected to the gates of the PMOS transistor $MP_2$ and NMOS transistor $MN_2$ to control the second circuit branch.

In the example of FIG. 4, PMOS transistors $MP_1$ and $MP_2$ are ON and OFF when their respective control input is a logical LOW (zero) and a logical HIGH (one), respectively. On the other hand, NMOS transistors $MN_1$ and $MN_2$ are ON and OFF when their respective control input is a logical HIGH (one) and a logical LOW (zero), respectively. Transistors $MP_1$, $MP_2$, $MN_1$ and $MN_2$ serve as ideal switches. The positive and negative supply voltages are arbitrarily set to V and zero volts, respectively, in this case. The initial output voltage of any voltage-mode phase interpolator is set to zero and the associated loading at the output load is equal to a capacitance C. Assume that input clocks $c_1$ and $c_2$ are switching from HIGH to LOW at time instants of 0 and Δ, respectively. In that case, the switch $MP_1$ is turned ON and the switch $MN_1$ is turned OFF at time instant of 0. Subsequently, the switch $MP_2$ is turned ON and the switch $MN_2$ is turned OFF at time instant of Δ.

The resistors R1 to R4 are selected based on the number of phases and the position of the interpolator 400 in the multi-phase interpolator 130 (see FIG. 3). The resistors R1 to R4 advantageously allow for improved linearity. In the example of FIG. 4, the resistors R1 and R2 in the first circuit branch each has a value $$R \frac{m}{(m-n)} \quad \text{(EQ. 1)}$$

and the resistors R3 and R4 in the second circuit branch each has a value $$R \frac{m}{n} \quad \text{(EQ. 2)}$$

where R is a constant resistance value. As explained, the phase interpolator 130 has (m+1) phases. For example, for a 5-phase interpolator 130, m=4 for all phase interpolators 400, n=0 for the first phase interpolator 400, n=1 for the second phase interpolator 400, n=2 for the third phase interpolator 400, and so on.

For the first voltage-mode phase interpolator (i.e., n=0), the output voltage $V_0(t)$ of the phase interpolator 400 may be represented as $$V(1-e^{-t/\tau_0}) \text{ where } \tau_0 = RC \text{ for } t \geq 0 \quad \text{(EQ. 3)}$$

Assume that the threshold voltage of succeeding circuits following the phase interpolator is equal to V/2. $V_0(t)$ crosses over the threshold voltage at time instant of $t_0 = \tau_0 \cdot \ln(2)$. For the phase interpolator 400 parameterized from n=1 to n=(m-1), the output voltage $V_n(t)$ is equal to $$V \frac{m-n}{m} (1 - e^{-t/\tau_0}) \text{ for } t < \Delta \text{ and} \quad \text{(EQ. 4)}$$

$$V\left[1 - \frac{n}{m} e^{-(t-\Delta)/\tau_0} - \frac{m-n}{m} e^{-t/\tau_0}\right] \text{ for } t \geq \Delta. \quad \text{(EQ. 5)}$$

The time instant $t_n$ at which $V_n(t)$ crosses over the threshold voltage of V/2 can be calculated accordingly. Although a closed-form solution does not exist, a first-order approximation gives the following result:

$$t_n = \tau_o \cdot \left[\ln(2) + \frac{n}{m} \frac{\Delta}{\tau_o} + \frac{(m-n)n}{2m^2}\left(\frac{\Delta}{\tau_o}\right)^2\right] \quad \text{(EQ. 6)}$$

The output voltage $V_m(t)$ of the last phase interpolator is the time-shift of the waveform $V_0(t)$ by $\Delta$. Therefore, $t_m$ is equal $\tau_0 \cdot \ln(2) + \Delta$. The integral nonlinearity (INL) and differential nonlinearity (DNL) of the n-th output clock $p_n$ are represented with respect to one LSB and defined as follows:

$$INL_n = \frac{(t_n - t_o - \Delta/m \cdot n)}{\Delta/m} \quad \text{(EQ. 7)}$$

$$DNL_n = \frac{(t_n - t_{n-1} - \Delta/m)}{\Delta/m} \quad \text{(EQ. 8)}$$

For a first-order approximation, the INL and DNL for the phase interpolator 400 may be calculated as follows:

$$INL_n = \frac{(m-n)n}{2m} \frac{\Delta}{\tau_o} \quad \text{(EQ. 9)}$$

$$DNL_n = \frac{(m-2n+1)}{2m} \frac{\Delta}{\tau_o} \quad \text{(EQ. 10)}$$

Figure 5:
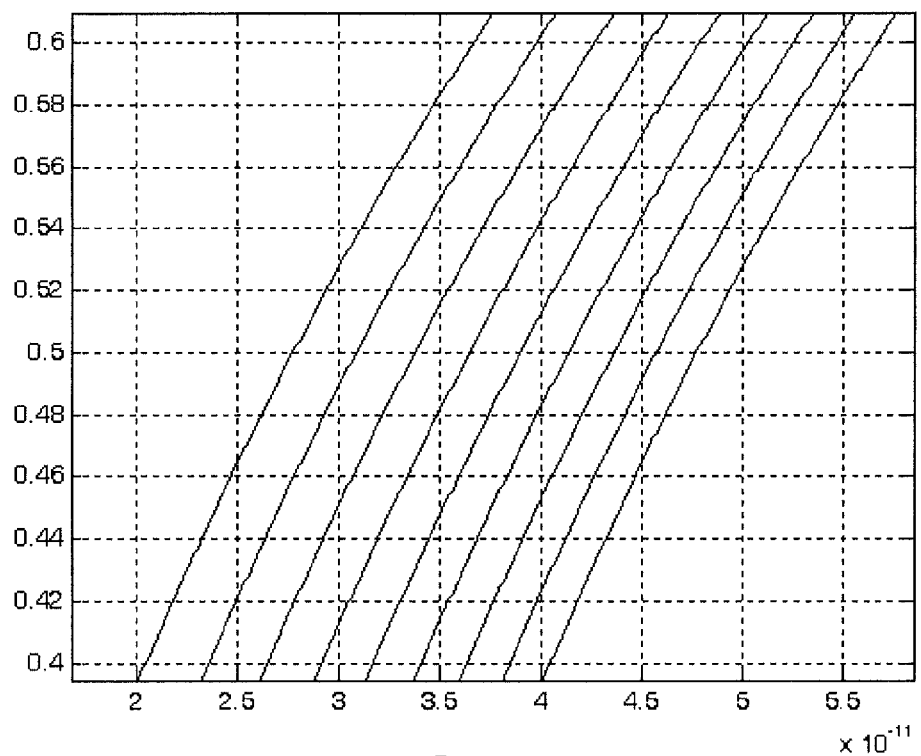
FIG. 5 shows example waveforms of output clocks of a multi-phase phase interpolator in accordance with an embodiment of the present invention.

FIG. 5 shows example waveforms of output clocks of a multi-phase phase interpolator in accordance with an embodiment of the present invention. The vertical axis represents voltage, while the horizontal axis represents time. The waveforms of FIG. 5 are from a multi-phase phase interpolator 130 with 9 single-ended voltage-mode phase interpolators 400. The waveforms, from left to right, are output clocks of phase interpolators for n=0, n=1, ..., n=7, and n=8. In the example of FIG. 5, $\Delta$ is 20 ps and $\tau_0$ is 40 ps.

Figure 6:
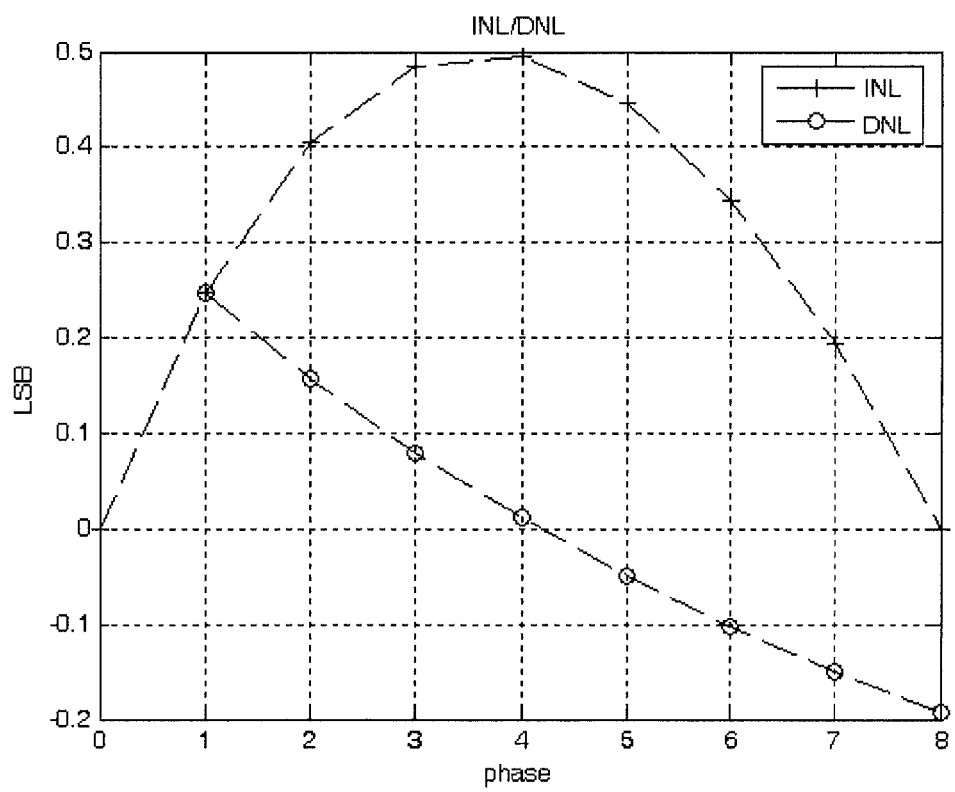
FIG. 6 shows the integral nonlinearity (INL) and differential nonlinearity (DNL) of each output clock in the example of FIG. 5.

FIG. 6 shows the INL and DNL of each output clock in the example of FIG. 5. In FIG. 6, the top plot is for the INL, and the bottom plot is for the DNL. The vertical axis represents LSB, and the horizontal axis represents phase. As can be seen from FIG. 6, the INL has its largest error at the center phase whereas the DNL has its largest errors at the boundary phases.

Figure 7:
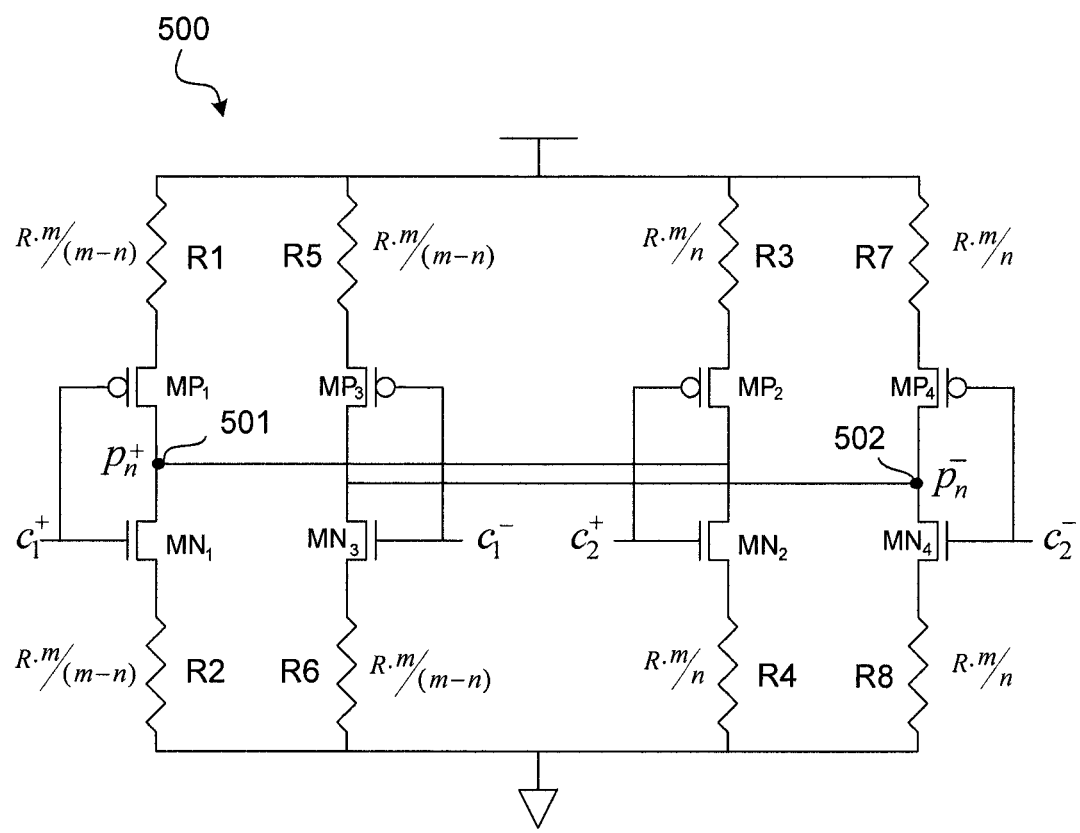
FIG. 7 shows a schematic diagram of a differential voltage-mode phase interpolator in accordance with an embodiment of the present invention.

FIG. 7 shows a schematic diagram of a differential voltage-mode phase interpolator 500 in accordance with an embodiment of the present invention. The phase interpolator 500 receives two differential input clocks $c_1$ and $c_2$ to generate a differential output clock $p_n$ across nodes 501 and 502. The different input clock $c_1$ comprises a pair of single-ended complementary input clocks $c_1(+)$ and $c_1(-)$. Similarly, the different input clock $c_2$ comprises a pair of single-ended complementary input clocks $c_2(+)$ and $c_2(-)$. The differential voltage-mode phase interpolator 500 is a particular embodiment of a phase interpolator 131 shown in FIG. 3. That is, the phase interpolator 500 may be used as a phase interpolator 131 in the multi-phase phase interpolator 130.

The phase interpolator 500 is a differential version of the phase interpolator 400 of FIG. 4. Accordingly, the equations derived for the phase interpolator 400 also apply to the phase interpolator 500.

In the example of FIG. 7, the phase interpolator 500 comprises two disjoint parts. The first disjoint part comprises resistors R1, R2, R3, and R4, PMOS transistors $MP_1$ and $MP_2$, and NMOS transistors $MN_1$ and $MN_2$. The second disjoint part comprises resistors R5, R6, R7, and R8, PMOS transistors $MP_3$ and $MP_4$, and NMOS transistors $MN_3$ and $MN_4$. Note that each disjoint part is essentially a single-ended voltage-mode phase interpolator 400. The analysis with regards to the circuit branches and sub-branches of each circuit branch in each disjoint part is thus the same as in the phase interpolator 400. It also follows that the values of resistors R1, R2, R5, and R6 are selected in accordance with EQ. 1, and the values of resistors R3, R4, R7, and R8 are selected in accordance with EQ. 2. The output nodes of the disjoint parts are connected together to provide a differential output clock $p_n$, which comprises a single-ended output clock $p_n(+)$ at a node 501 and a single-ended output clock $p_n(-)$ at a node 502.

In order to reduce INL and DNL, different RC constants $\tau_n$ can be assigned to each voltage-mode phase interpolator. This aspect of the present invention is now explained beginning with FIG. 8.

Figure 8:
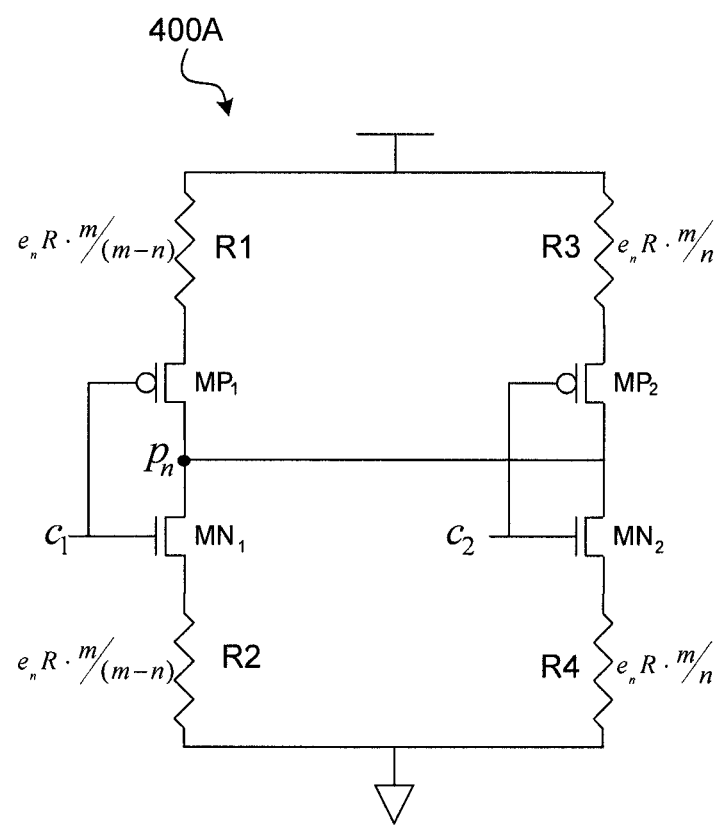
FIG. 8 shows a schematic diagram of a single-ended voltage-mode phase interpolator in accordance with an embodiment of the present invention.

FIG. 8 shows a schematic diagram of a single-ended voltage-mode phase interpolator 400A in accordance with an embodiment of the present invention. The phase interpolator 400A may be employed as a phase interpolator 131 in the multi-phase interpolator 130. The phase interpolator 400A is a particular embodiment of the phase interpolator 400 of FIG.

4. The phase interpolator 400A is the same as the phase interpolator 400 except that the phase interpolator 400A has different resistance values.

Figure 9:
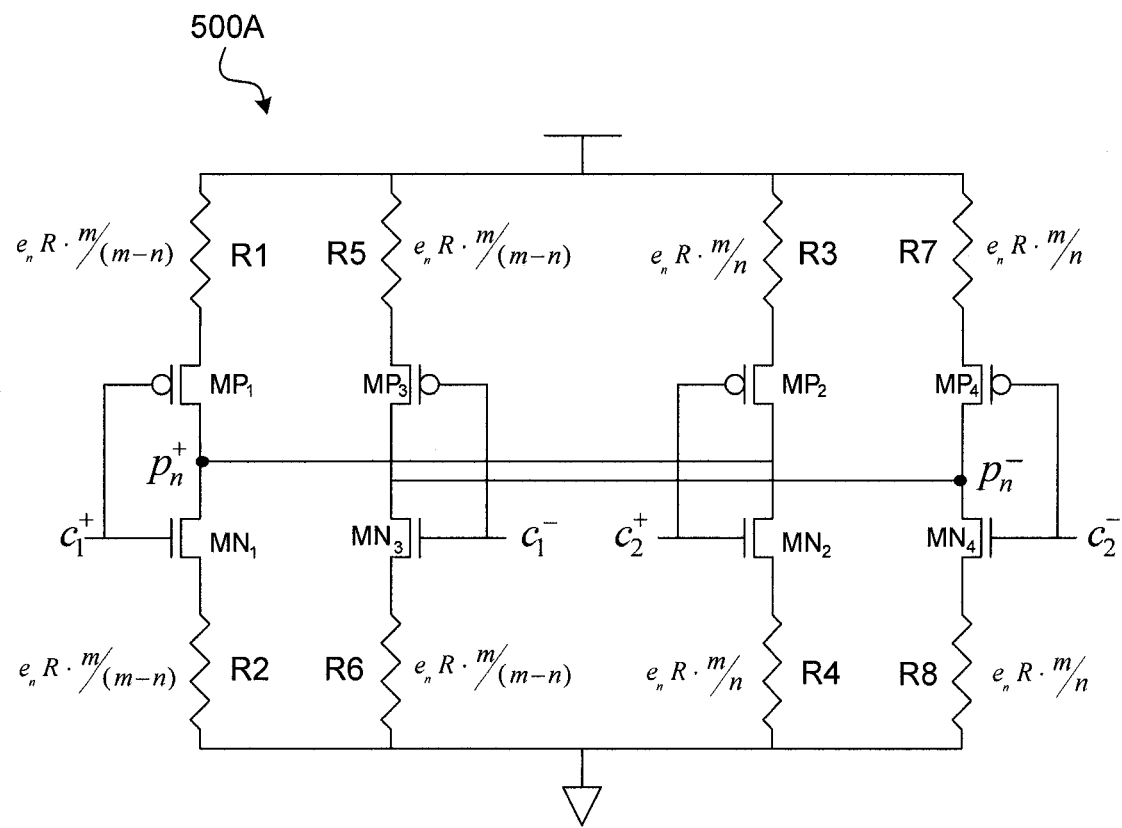
FIG. 9 shows a schematic diagram of a differential voltage-mode phase interpolator in accordance with an embodiment of the present invention.

FIG. 9 shows a schematic diagram of a differential voltage-mode phase interpolator 500A in accordance with an embodiment of the present invention. The phase interpolator 500A may be employed as a phase interpolator 131 in the multi-phase interpolator 130. The phase interpolator 500A is a particular embodiment of the phase interpolator 500 of FIG. 7. The phase interpolator 500A is the same as the phase interpolator 500 except that the phase interpolator 500A has different resistance values.

In the embodiments of FIGS. 8 and 9, the resistance of a voltage-mode phase interpolator is multiplied with an error correction term $e_n$ to adjust its value. In doing so, the RC constants $\tau_n$ of each voltage-mode phase interpolator can be changed individually. Similarly, if the resistance values remain unchanged, the capacitance loading of each phase interpolator can be multiplied with the same error correction term $e_n$ to adjust the time constant.

For a time constant $\tau_n$, the time instant $t_n$ at which $V_n(t)$ crosses over the threshold voltage of V/2 can be calculated. Although a closed-form solution does not exist, a first-order approximation gives the following:

$$t_n = \tau_n \cdot \left[\ln(2) + \frac{n}{m} \cdot \frac{\Delta}{\tau_n} + \frac{(m-n)n}{2m^2}\left(\frac{\Delta}{\tau_n}\right)^2\right] \quad \text{(EQ. 11)}$$

where $\tau_n = e_n RC$

In order to reduce INL and DNL, the INL of each phase interpolator is set to zero and the required $\tau_n$ can then be calculated. A closed form solution cannot be derived. However, a first-order approximation of the required $\tau_n$ gives the following result:

$$\tau_n = \tau_0 \left[1 - \frac{(m-n)n}{2\ln(2)m^2}\left(\frac{\Delta}{\tau_0}\right)^2\right] \quad \text{(EQ. 12)}$$

From EQ. 12, the error correction term $e_n$ in the resistors shown in FIGS. 8 and 9 is then set to $$1 - \frac{(m-n)n}{2\ln(2)m^2}\left(\frac{\Delta}{\tau_0}\right)^2 \quad \text{(EQ. 13)}$$

The effective resistance at each phase interpolator is changed accordingly. More specifically, in phase interpolators 400A and 500A, resistors R1, R2, R5, and R6 each has a value $$e_n R \frac{m}{(m-n)} \quad \text{(EQ. 14)}$$

and the resistors R3, R4, R7, and R8 each has a value $$e_n R \frac{m}{n} \quad \text{(EQ. 15)}$$

where $e_n$ is the error correction term given by EQ. 13. Note that EQ. 14 is EQ. 1 multiplied by the error correction term $e_n$, and EQ. 15 is EQ. 2 multiplied by the error correction term $e_n$.

Figure 10:
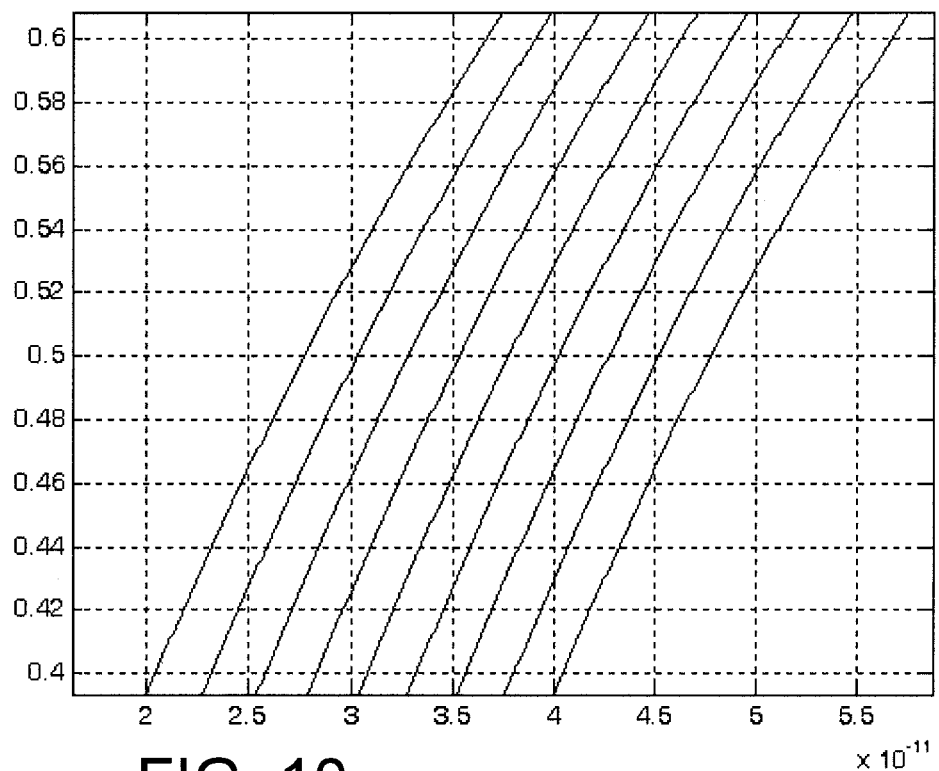
FIG. 10 shows example waveforms of output clocks of a multi-phase phase interpolator in accordance with an embodiment of the present invention.

FIG. 10 shows example waveforms of output clocks of a multi-phase phase interpolator in accordance with an embodiment of the present invention. The vertical axis represents voltage, while the horizontal axis represents time. The waveforms of FIG. 10 are from a multi-phase phase interpolator 130 with 9 single-ended voltage-mode phase interpolators 400A. A first-order error correction $e_n$ (see EQ. 13) is applied to the resistance values of the phase interpolators 400A.

Figure 11:
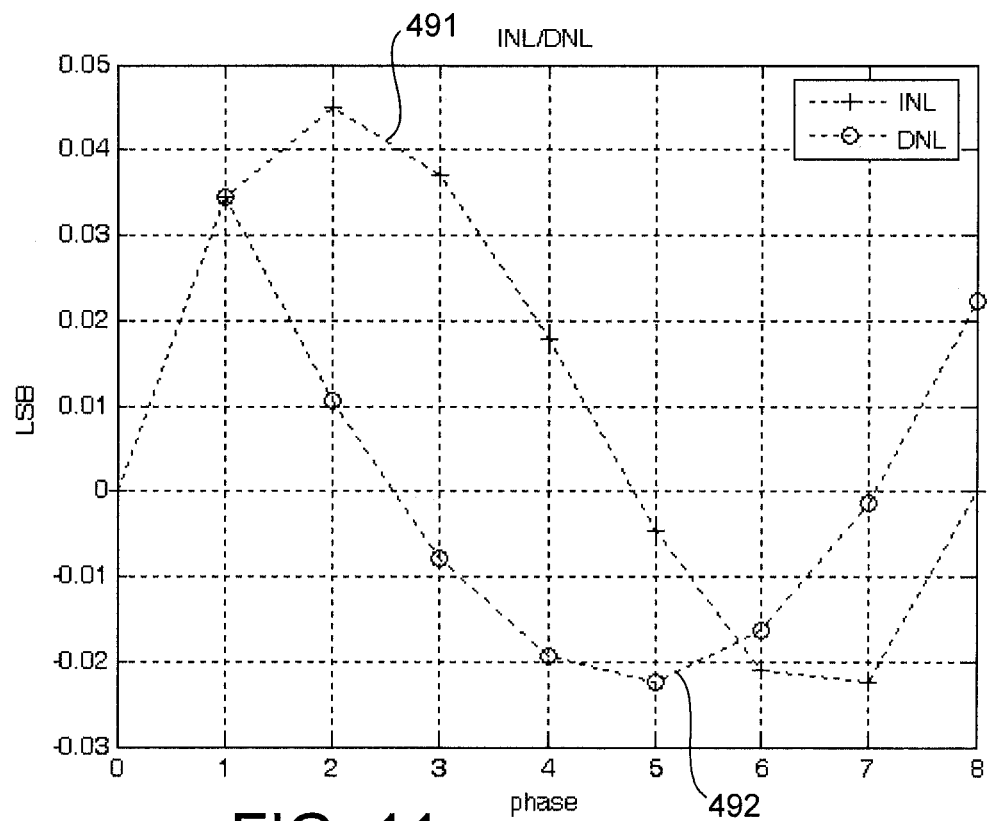
FIG. 11 shows corresponding INL and DNL of the waveforms of FIG. 10.

In FIG. 10, the waveforms, from left to right, are output clocks of phase interpolators 400A for n=0, n=1, ..., n=7, and n=8. The corresponding INL (plot 491) and DNL (plot 492) plots are shown in FIG. 11. The vertical axis represents LSB, and the horizontal axis represents phase.

Figure 12:
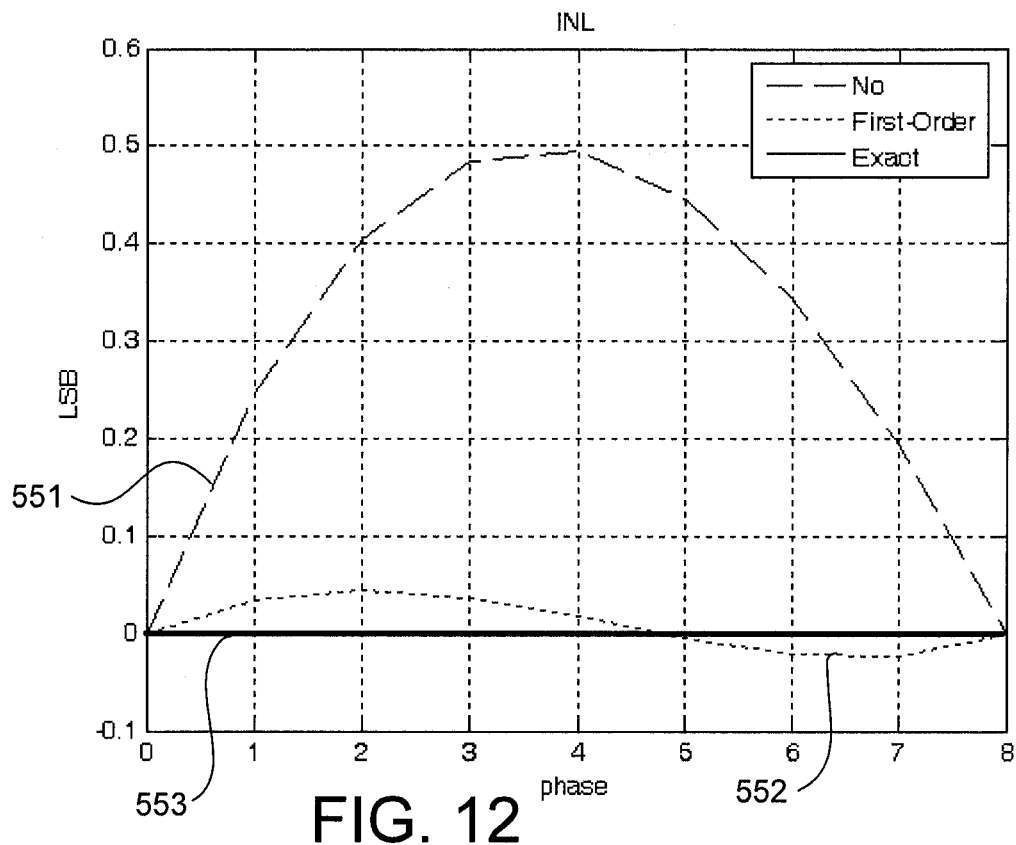
FIG. 12 shows INL for three different scenarios.
Figure 13:
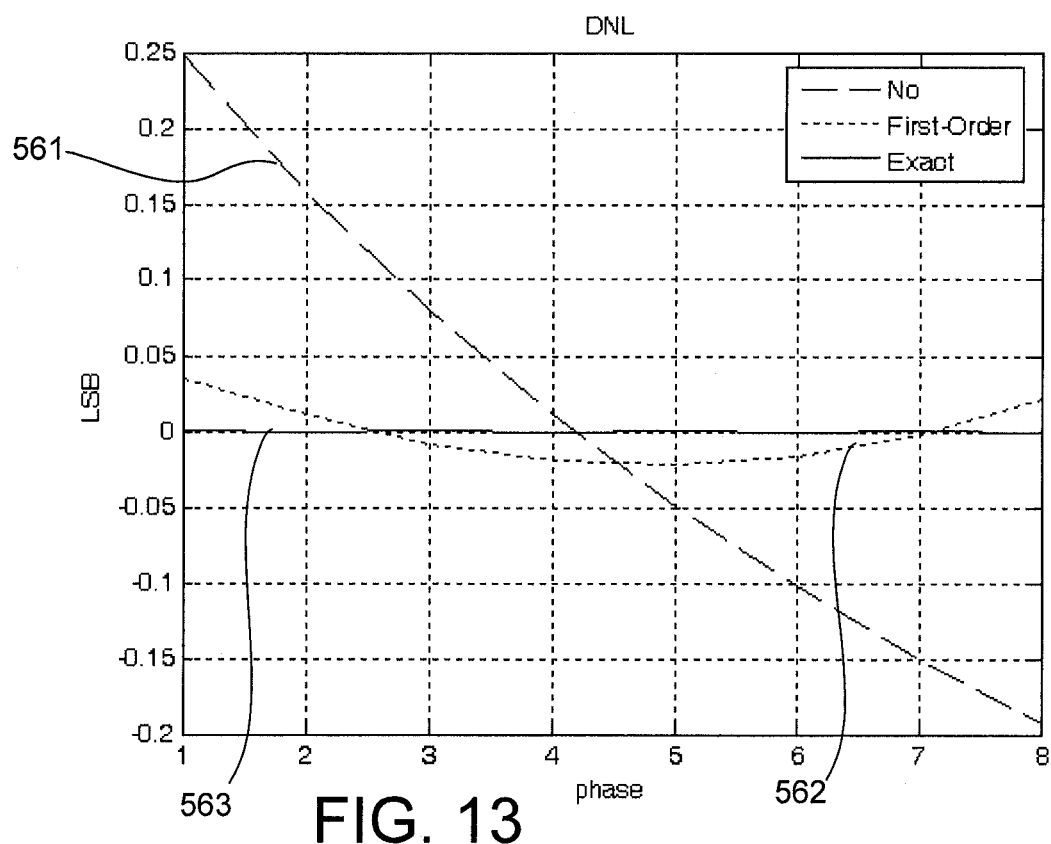
FIG. 13 shows DNL for the scenarios of FIG. 12.

Using computer simulations, an exact value of $\tau_n$ that gives zero INL can be calculated. FIG. 12 shows the INL for three different scenarios of "no error correction" (plot 551), "first-order error correction" (plot 552), and "exact error correction" (plot 553). FIG. 13 shows the DNL for three different scenarios of "no error correction" (plot 561), "first-order error correction" (plot 562), and "exact error correction" (plot 533). The values of error correction term $e_n$ for these three scenarios are shown in Table 1.

TABLE 1

| | No Correction | First-Order Correction | Exact Correction |
|---|---|---|---|
| $e_0$ | 1 | 1 | 1 |
| $e_1$ | 1 | 0.9803 | 0.9771 |
| $e_2$ | 1 | 0.9662 | 0.9620 |
| $e_3$ | 1 | 0.9577 | 0.9542 |
| $e_4$ | 1 | 0.9549 | 0.9532 |
| $e_5$ | 1 | 0.9577 | 0.9582 |
| $e_6$ | 1 | 0.9662 | 0.9681 |
| $e_7$ | 1 | 0.9803 | 0.9823 |
| $e_8$ | 1 | 1 | 1 |

Figure 14:
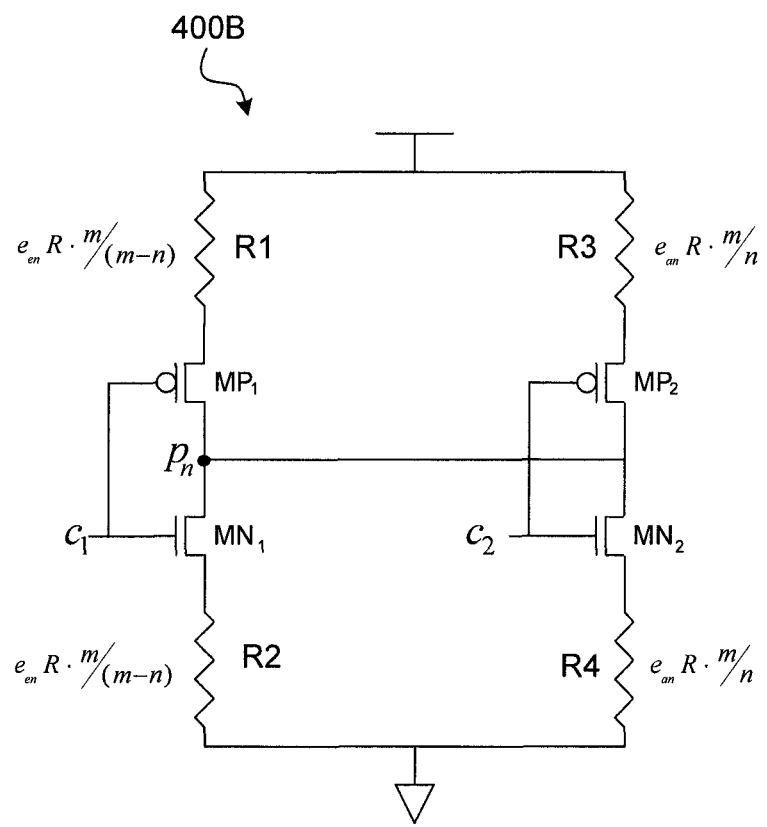
FIG. 14 shows a schematic diagram of a single-ended voltage-mode phase interpolator in accordance with an embodiment of the present invention.

FIG. 14 shows a schematic diagram of a single-ended voltage-mode phase interpolator 400B in accordance with an embodiment of the present invention. The phase interpolator 400B may be employed as a phase interpolator 131 in the multi-phase interpolator 130. The phase interpolator 400B is a particular embodiment of the phase interpolator 400 of FIG. 4. The phase interpolator 400B is the same as the phase interpolator 400 except that the phase interpolator 400B has different resistance values.

Figure 15:
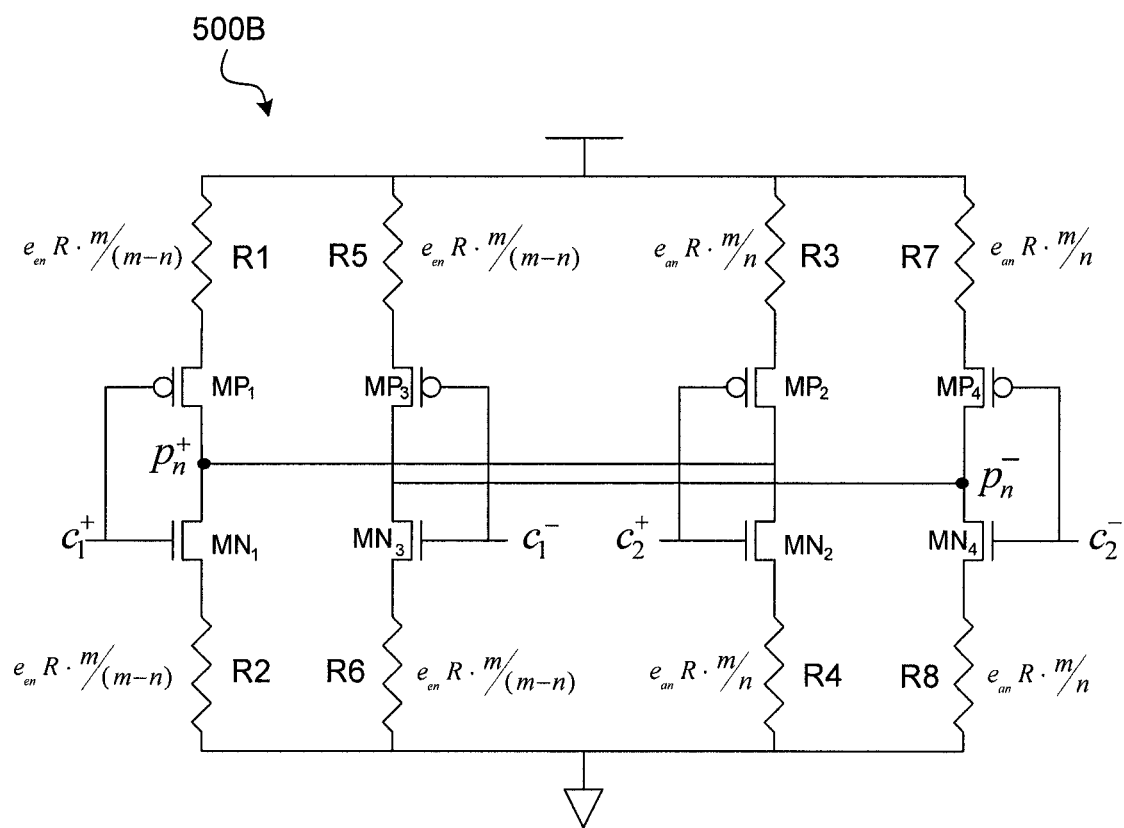
FIG. 15 shows a schematic diagram of a differential voltage-mode phase interpolator in accordance with an embodiment of the present invention.

FIG. 15 shows a schematic diagram of a differential voltage-mode phase interpolator 500B in accordance with an embodiment of the present invention. The phase interpolator 500B may be employed as a phase interpolator 131 in the multi-phase interpolator 130. The phase interpolator 500B is a particular embodiment of the phase interpolator 500 of FIG. 7. The phase interpolator 500B is the same as the phase interpolator 500 except that the phase interpolator 500B has different resistance values.

In the embodiments of FIGS. 14 and 15, different RC time constants are assigned to the first and second circuit branches whereas their total RC time constant is kept the same. In these embodiments, the resistors in the first and second circuit branches are multiplied by an error correction term $e_{en}$ and $e_{an}$, respectively, to adjust its value. More specifically, in FIGS. 14 and 15, the resistors R1, R2, R5, and R6 are multiplied by an error correction term $e_{en}$, while the resistors R3, R4, R7, and R8 are multiplied by an error correction term $e_{an}$ so that the RC constants of the circuit branches in each phase interpolator can be changed individually. If the total RC time constant is set to $\tau_0$, where $\tau_0 = RC$, this constraint can be written as:

$$1 = \frac{n(m-n)e_{en}e_{an}}{n \cdot e_{en} + (m-n)e_{an}} \quad \text{(EQ. 16)}$$

For the phase interpolator 400B or 500B parameterized from n=1 to n=m−1, its output voltage $V_n(t)$ is equal to $$V \frac{(m-n)e_{an}}{n \cdot e_{en} + (m-n)e_{an}} (1 - e^{-t/\tau_0}) \text{ for } t < \Delta \text{ and} \quad \text{(EQ. 17)}$$

$$V \left[ 1 - \frac{n \cdot e_{en}}{n \cdot e_{en} + (m-n)e_{an}} e^{-(t-\Delta)/\tau_0} - \frac{(m-n)e_{an}}{n \cdot e_{en} + (m-n)e_{an}} e^{-t/\tau_0} \right] \text{ for } t \geq \Delta \quad \text{(EQ. 18)}$$

For each voltage-mode phase interpolator, the time instant $t_n$ at which $V_n(t)$ crosses over the threshold voltage of V/2 can be calculated. In order to reduce INL and DNL, the INL of each phase interpolator is set to zero and the required $e_{en}$ and $e_{an}$ are calculated. The values of $e_{en}$ and $e_{an}$ to achieve exact cancellations are shown in Table 2.

TABLE 2

| n | $e_{en}$ | $e_{an}$ |
|---|---|---|
| 0 | 1 | 1 |
| 1 | 0.9716 | 1.2573 |
| 2 | 0.9437 | 1.2180 |
| 3 | 0.9163 | 1.1796 |
| 4 | 0.8894 | 1.1420 |
| 5 | 0.8630 | 1.1053 |
| 6 | 0.8371 | 1.0693 |
| 7 | 0.8118 | 1.0343 |
| 8 | 1 | 1 |

Figure 16:
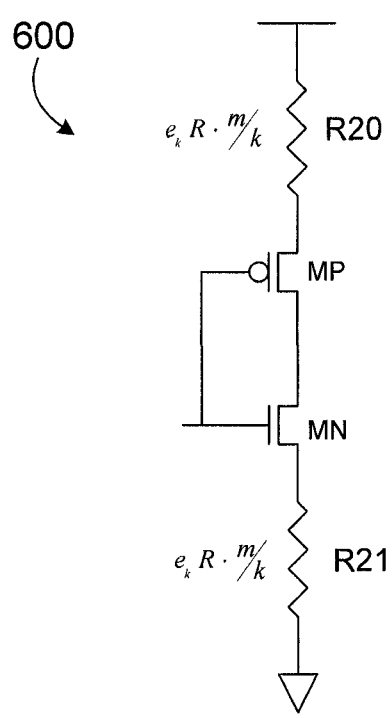
FIG. 16 shows a schematic diagram of a circuit branch in accordance with an embodiment of the present invention.

FIG. 16 shows a schematic diagram of a circuit branch 600 in accordance with an embodiment of the present invention. In the example of FIG. 16, the circuit branch 600 comprises a first sub-branch comprising a PMOS transistor MP and a resistor R20, and a second sub-branch comprising an NMOS transistor MN and a resistor R21. The circuit branch 600 may be employed as a circuit branch of the voltage-mode phase interpolators described above.

In the example of FIG. 16, the resistors R20 and R21 each has a value $$e_k R \frac{m}{k} \quad \text{(EQ. 19)}$$

Figure 17:
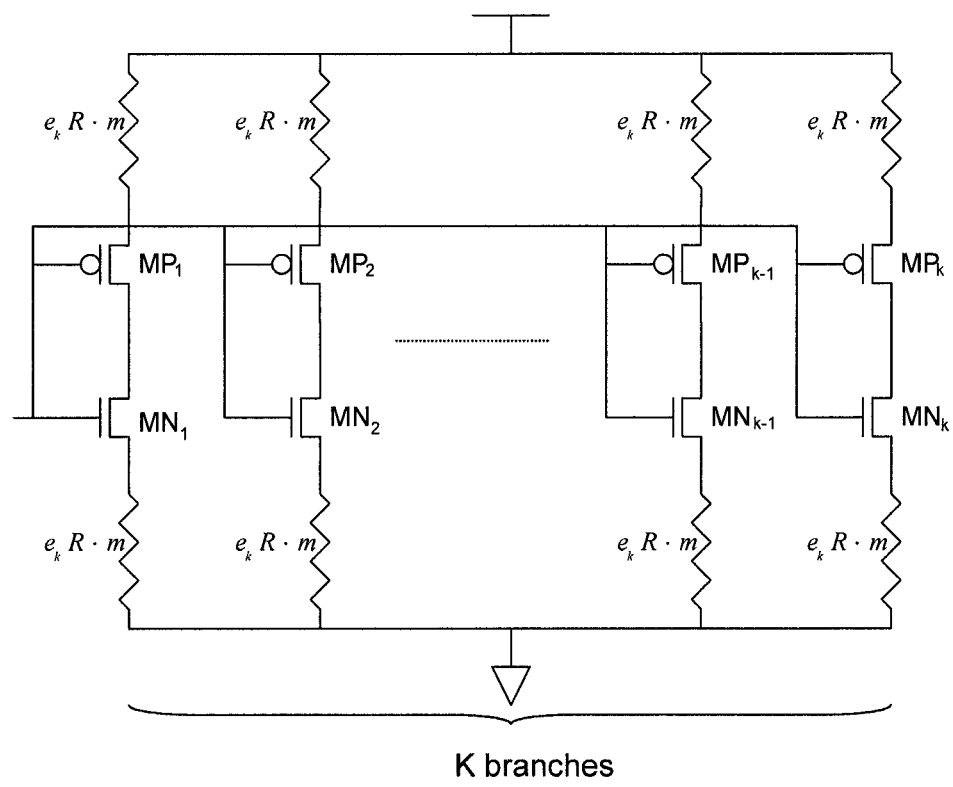
FIG. 17 shows a schematic diagram of a circuit branch implemented using several identical circuit branches in accordance with an embodiment of the present invention.

In situations where the resistance value given by EQ. 19 is not readily available or implementable in an integrated circuit, an equivalent circuit branch can be implemented by shutting k identical circuit branches. This is shown in FIG. 17, where the circuit branch 600 is implemented using k identical circuit branches.

Improved multi-phase phase interpolators have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A multi-phase phase interpolator having a plurality of voltage-mode phase interpolators, the multi-phase interpolator receiving a first input clock and a second input clock to generate a plurality of equally spaced output clocks, the first input clock leading the second input clock, a first voltage-mode phase interpolator in the plurality of voltage-mode phase interpolators being configured to generate a first output clock in the plurality of output clocks, the first voltage-mode phase interpolator comprising:

a first circuit branch configured to be controlled by the first input clock, the first circuit branch comprising a first sub-branch and a second sub-branch, the first sub-branch of the first circuit branch comprising a first transistor in series with a first resistor, the second sub-branch of the first circuit branch comprising a second transistor in series with a second resistor, the first transistor and the second transistor being coupled to the first input clock such that the first transistor is ON when the second transistor is OFF and vice versa, the first sub-branch of the first circuit branch being configured such that current flows through the first resistor and the first transistor when the first transistor is ON, the second sub-branch of the first circuit branch being configured such that current flows through the second resistor and the second transistor when the second transistor is ON, a terminal of the first transistor and a terminal of the second transistor being coupled together to an output node of the first voltage-mode phase interpolator; and a second circuit branch configured to be controlled by the second input clock, the second circuit branch comprising a first sub-branch and a second sub-branch, the first sub-branch of the second circuit branch comprising a third transistor in series with a third resistor, the second sub-branch of the second circuit branch comprising a fourth transistor in series with a fourth resistor, the third transistor and the fourth transistor being coupled to the second input clock such that the third transistor is ON when the fourth transistor is OFF and vice versa, the first sub-branch of the second circuit branch being configured such that current flows through the third resistor and the third transistor when the third transistor is ON, the second sub-branch of the second circuit branch being configured such that current flows through the fourth resistor and the fourth transistor when the fourth transistor is ON, a terminal of the third transistor and a terminal of the fourth transistor being coupled together to the output node of the first voltage-mode phase interpolator.

2. The multi-phase phase interpolator of claim 1 wherein the first input clock, the second input clock, and the plurality of output clocks comprise differential signals.

3. The multi-phase phase interpolator of claim 1 wherein the first input clock, the second input clock, and the plurality of output clocks comprise single-ended signals.

4. The multi-phase phase interpolator of claim 1 wherein the first and third transistor comprise PMOS transistors and the second and fourth transistors comprise NMOS transistors.

5. The multi-phase phase interpolator of claim 1 wherein the first sub-branch of the first circuit branch flows current from a positive power supply through the first resistor and the first transistor when the first transistor is ON.

6. The multi-phase phase interpolator of claim 1 wherein the first transistor comprises a PMOS transistor, the second transistor comprises an NMOS transistor, and the first input clock is coupled to a gate of the first transistor and a gate of the second transistor to control the first circuit branch.

7. The multi-phase phase interpolator of claim 6 wherein the third transistor comprises a PMOS transistor, the fourth transistor comprises an NMOS transistor, and the second input clock is coupled to a gate of the third transistor and a gate of the fourth transistor to control the second circuit branch.

8. The multi-phase phase interpolator of claim 1 wherein a second voltage-mode phase interpolator in the plurality of voltage-mode phase interpolators is configured as a delay element to generate a second output clock in the plurality of output clocks, the second output clock being the first input clock inverted and delayed by a first amount.

9. The multi-phase phase interpolator of claim 8 wherein a third voltage-mode phase interpolator in the plurality of voltage-mode phase interpolators is configured as a delay element to generate a third output clock in the plurality of output clocks, the third output clock being the second input clock inverted and delayed by a second amount.

* * * * *